US 6,736,205 B2

United States Patent
Hasenoehrl et al.

(10) Patent No.: US 6,736,205 B2
(45) Date of Patent: *May 18, 2004

(54) AFT IN FLIGHT ENTERTAINMENT COOLING SYSTEM

(75) Inventors: Thomas R. Hasenoehrl, Stanwood, WA (US); Charles E. Kusuda, Mukilteo, WA (US); Theodore M. Barry, Edmonds, WA (US)

(73) Assignee: The Boeing Company, Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/852,394

(22) Filed: May 9, 2001

(65) Prior Publication Data

US 2002/0020515 A1 Feb. 21, 2002

Related U.S. Application Data

(60) Provisional application No. 60/205,627, filed on May 18, 2000.

(51) Int. Cl.⁷ ................................................. B60H 1/00
(52) U.S. Cl. .......................... 165/202; 165/41; 454/76; 244/117 R
(58) Field of Search .................. 165/41, 202, 235, 165/80.3; 454/76; 244/117 R

(56) References Cited

U.S. PATENT DOCUMENTS

| 2,825,212 A | | 3/1958 | Linde |
| 2,884,845 A | | 5/1959 | Beggs |
| 3,387,648 A | * | 6/1968 | Ward, Jr. et al. ............. 165/47 |
| 3,930,553 A | | 1/1976 | Kopera et al. |
| 4,394,861 A | | 7/1983 | Sciortino |
| 4,739,823 A | * | 4/1988 | Howard .................... 165/41 X |
| 4,934,154 A | | 6/1990 | Altoz et al. |
| 5,474,120 A | | 12/1995 | Severson et al. |
| 5,894,987 A | | 4/1999 | Layne et al. |

FOREIGN PATENT DOCUMENTS

| DE | 3824471 | 2/1990 |
| EP | 0278717 | 8/1988 |
| EP | 0738655 | 10/1996 |

* cited by examiner

Primary Examiner—Ljiljana Ciric
(74) Attorney, Agent, or Firm—Conrad O. Gardner

(57) ABSTRACT

An aft in flight entertainment system "IFE" which allows air to be directed to and exhausted from the IFE equipment in isolation from the cabin conditioned air. Further potential IFE generated smoke may be kept isolated from the cabin air. The aft IFE equipment is located in the rear sections of the aircraft. Valves controlling air flow are responsive to input signals. A fan draws cooling air through a video control cabinet through a duct which splits into an overhead branch and an inboard branch.

4 Claims, 3 Drawing Sheets

Fig. 3

| IFE COOLING SYS CONTROLLER (36) INPUTS | | | | | | | | | IFE COOLING SYS CONTROLLER (36) OUTPUTS | | | |
|---|---|---|---|---|---|---|---|---|---|---|---|---|
| MASTER IFE SYSTEM POWER (16) | NORMAL OPERATION MODES | | OVERRIDE OPERATION MODES | | | | | AIR/GROUND SENSOR (10) | IFE COOLING OVERBOARD EXHAUST VALVE (1) | IFE COOLING OVERBOARD EXHAUST VALVE (2) | IFE COOLING INBOARD EXHAUST VALVE (3) | IFE COOLING EXHAUST FAN (6) |
| | OAT (14) T<45° | OAT (14) T>45° | SMOKE DETECTOR INDICATING SMOKE (5) | NO FRESH AIR (24) | FIRE SYSTEM ARMED (12) | ADDITIONAL OVERBOARD EXHAUST FLOW (18) | REDUCED RECIRC. AIR (20) | REDUCED FRESH AIR (22) | | | | | |
| OFF | | | | | | | | | — | — | — | — | — |
| ON | ✓ | | | | | | | | AIR MODE | CLOSED | CLOSED | OPENED | OFF |
| ON | ✓ | | | | | | | | GND MODE | OPENED | OPENED | CLOSED | OFF |
| ON | | ✓ | | | | | | | AIR MODE | CLOSED | CLOSED | OPENED | ON |
| ON | | ✓ | | | | | | | GND MODE | OPENED | OPENED | OPENED | ON |
| ON | | | ✓ | | | | | | GND MODE | OPENED | CLOSED | CLOSED | ON |
| ON | | | | ✓ | | | | | AIR MODE | OPENED | OPENED | CLOSED | OFF |
| ON | | | | ✓ | | | | | GND MODE | OPENED | OPENED | CLOSED | OFF |
| ON | | | | | ✓ | | | | AIR MODE | OPENED | CLOSED | OPENED | OFF |
| ON | | | | | ✓ | | | | GND MODE | CLOSED | CLOSED | CLOSED | ON |
| ON | | | | | | ✓ | | | AIR MODE | CLOSED | CLOSED | CLOSED | OFF |
| ON | | | | | | ✓ | | | GND MODE | OPENED | OPENED | CLOSED | OFF |
| ON | | | | | | | | | AIR MODE | CLOSED | CLOSED | OPENED | ON |
| ON | | | | | | | OFF | ON | AIR MODE | CLOSED | CLOSED | OPENED | ON |
| ON | | | | | | | ON | OFF | AIR MODE | CLOSED | CLOSED | OPENED | ON |
| ON | | | | | | | ON | ON | AIR MODE | CLOSED | CLOSED | CLOSED | OFF |

AFT IN FLIGHT ENTERTAINMENT COOLING SYSTEM

CROSS-REFERENCE TO RELATED APPLICATIONS

This application claims the benefit of U.S. Provisional Application 60/205,627 filed May 18, 2000.

FIELD OF THE INVENTION

This invention relates to aircraft air conditioning systems, and more particularly to a cooling system for in flight entertainment system electronics.

BACKGROUND OF THE INVENTION

Many systems are available for providing audio and video entertainment as well as telecommunications to airline passengers. Much of the innovation has concerned the enablement of higher fidelity systems to increase their appeal to passengers so that airborne systems compare with familiar ground entertainment systems. However the rapid proliferation of these electronic devices has added a significant burden to the host aircraft's power generation and air conditioning systems.

Thermal management of (IFE) electronics is essential to maximizing the life of the electronics and preserving the quality of the aircraft air conditioning.

Prior Art

The prior patent literature includes U.S. Pat. No. 5,894,987 to Layne et.al. which discloses a ram air for cooling a heat generating component. Air is introduced through the air inlet and exhausted through an outlet. The component may be an electrical component, engine, or part.

U.S. Pat. No. 5,474,120 to Severson et. al. shows the use of cool air to regulate the heat of electronics. The system has a primary and secondary source of air.

U.S. Pat. No. 3,930,553 to Greenough shows an aircraft cooling system having separate heat exchangers for the pilot and accessories. The accessory heat exchanger operates at higher temperatures than would otherwise be comfortable for occupants of an aircraft.

U.S. Pat. No. 2,825,212 to Darges et.al. discloses an aircraft heating and ventilating system which uses outside air having a duct. The temperature of the air is regulated by a controller.

U.S. Pat. No. 4,394,861 to Scortino is illustrative of a system for ducting outside air directly to a face mask. The outside air is used for breathing when the inside of the aircraft has become contaminated.

SUMMARY OF THE INVENTION

It is an object of the present invention to satisfy the equipment cooling requirements of central command equipment of the (IFE) system.

It is another object of the present invention to provide a cooling system necessary to manage the heat dissipated by the same equipment so that the airplane cabin environment will still be comfortable to passengers and crew.

Accordingly there is provided a dedicated (IFE) electronics cooling system for extending the service life of the passenger system electronics and preserving the quality of the host aircraft's passenger air conditioning system.

DETAILED DESCRIPTION OF THE PREFERRED EMBODIMENT

Figure 1:
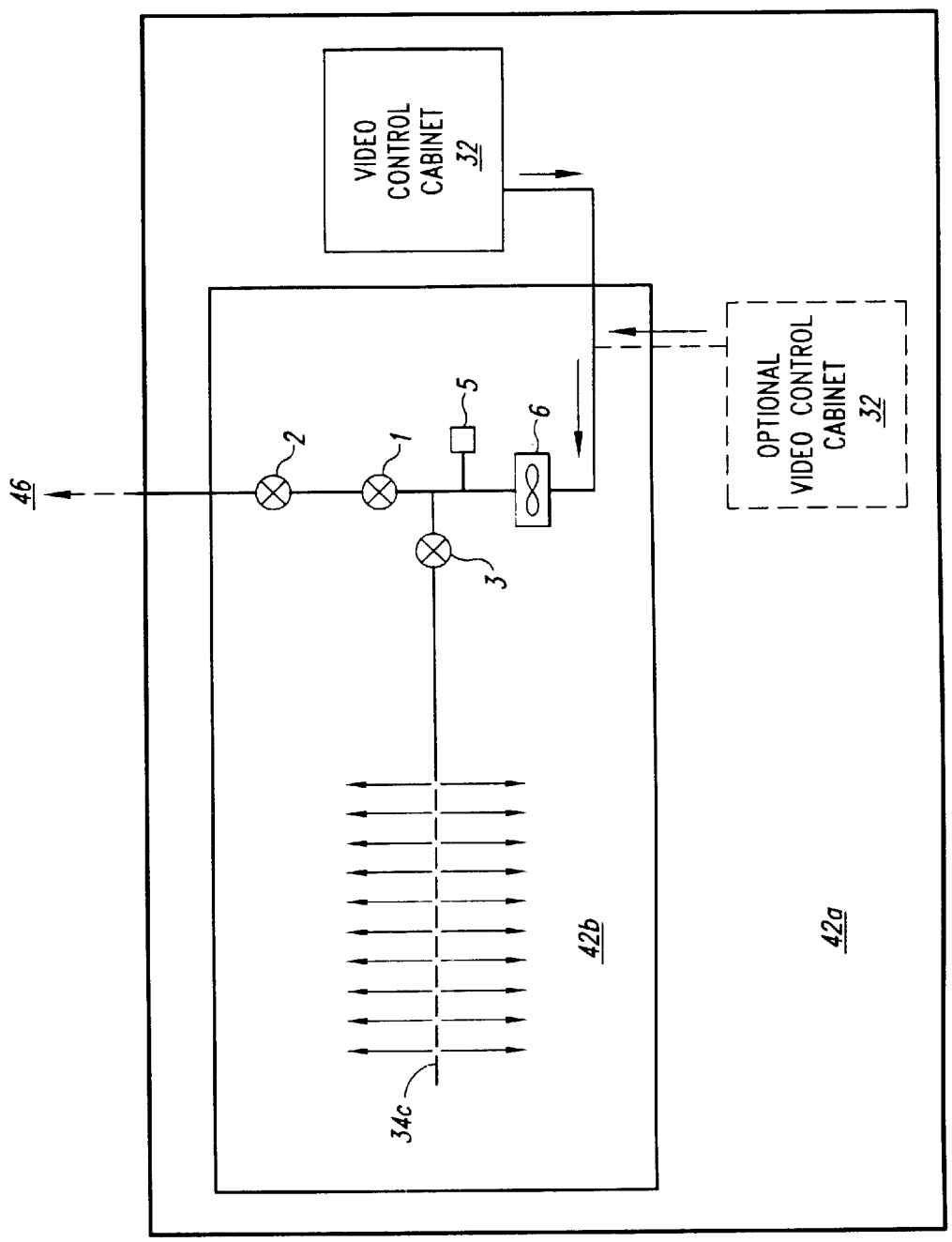
FIG. 1 is a simplified block diagram of air flow in the present aft in flight entertainment cooling system.
Figure 2:
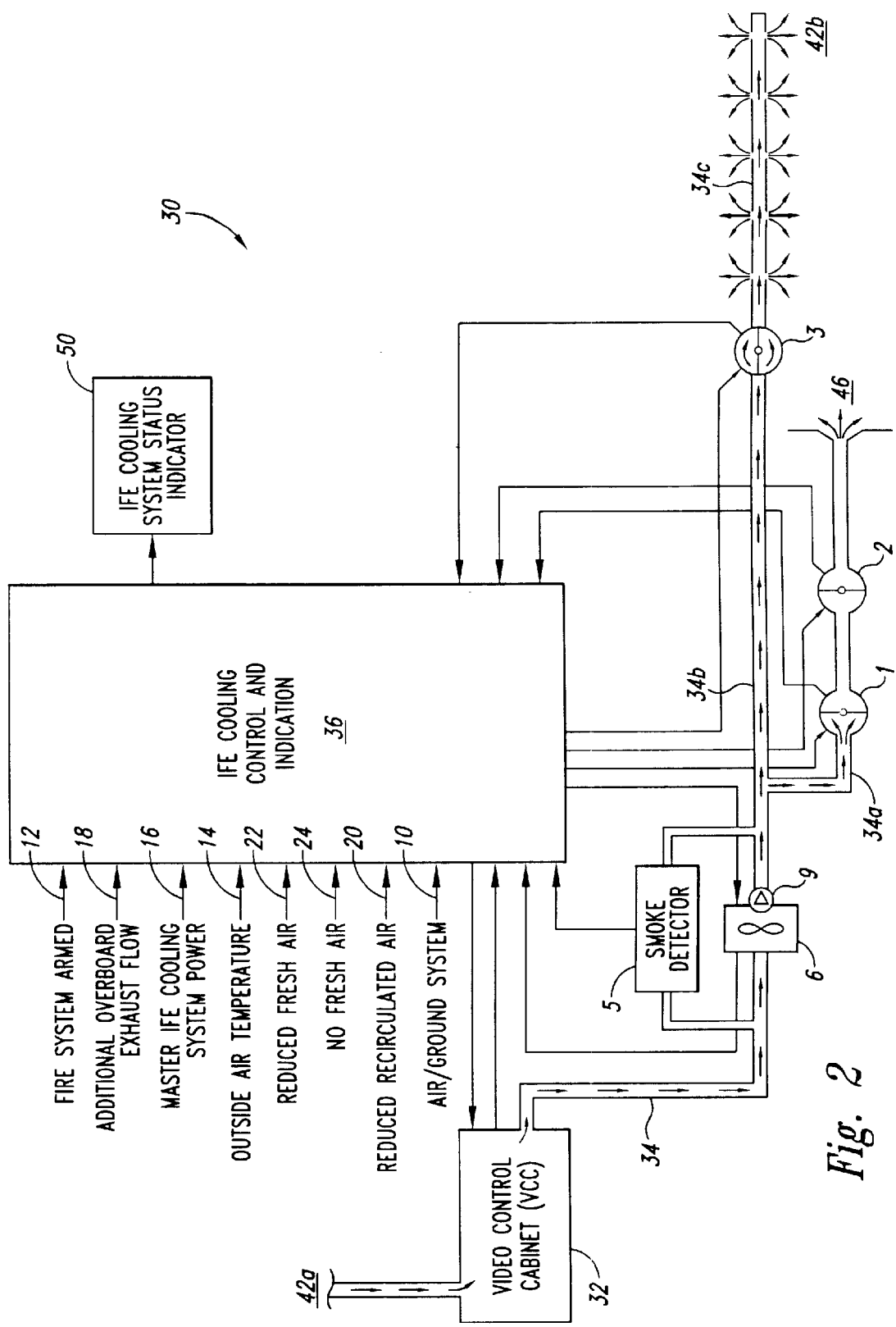
FIG. 2 is a schematic representation of the present aft in flight entertainment cooling system; and, FIG. 3 is illustrative of the valve control logic in the control means of the aft in flight entertainment cooling system of FIG. 2.

Turning now to FIG. 1 illustrative of the valves controlling air flow in the system of FIG. 2., it should be noted that the conditions for valve control in response to input signals are shown in FIG. 3. Fan 6 draws cooling air through video control cabinet (VCC) 32 through duct 34. Duct 34 splits into overboard branch 34(a) and inboard branch 34(b). Inboard branch 34(b) comprises a perforated 110-inch long, seven-inch diameter duct 34(c) exhausting under the aft cargo door into the bilge of the cargo compartment 42(b) downstream from shutoff valve 3. Perforations 34 (c) in the duct comprise holes of 0.625 inches in diameter sized to convert all of the static pressure to dynamic pressure. Ground exhaust branch 34(a) has two shutoff valves 1 and 2 in series prior to a round approximately 46 square inch aircraft skin penetration 46. A smoke detector 5 is mounted across fan 6 to sample air downstream of fan 6. Inboard shutoff valve 3 is opened when one of overboard exhaust valves 1 or 2 is closed.

When the aircraft is on the ground and the outside air temperature (OAT) is greater than 45 degrees F., the system exhausts overboard through valves 1 and 2. While on the ground with OAT less than 45 degrees F., or when the aircraft is in the air, the present system exhausts inboard. An advisory for failure of both ground exhaust valves, and a status for single component failure or smoke detection in the system is displayed on IFE cooling system status indicator 50.

Although this invention has been illustrated and described in connection with the particular embodiment illustrated, it will be apparent to those skilled in the art that various changes may be made therein without departing from the spirit of the invention as set forth in the appended claims.

What is claimed is:

1. In combination with in an aircraft:

An in-flight entertainment system having in-flight entertainment system electronics disposed in the aft section of the aircraft;

a video control cabinet for housing said in-flight entertainment system electronics;

a cooling system for conducting air from said video control cabinet for housing said in-flight entertainment system electronics; and, control means for venting heated air from said video control cabinet to the outside of an aircraft cabin or to the aircraft cargo compartment depending upon the location of the aircraft in the air or on the ground and upon the outside aircraft temperature.

2. The invention according to claim 1 wherein said control means vents said heated air into an aircraft cargo compartment when (a) the aircraft is on the ground and the outside ambient temperature is less than 45 degrees F., and (b) when the aircraft is airborne.

3. The invention according to claim 1 wherein said video control cabinet is for utilization in the aft section of the aircraft.

4. In combination with an aircraft entertainment cooling system:

a video control cabinet;

a fan for drawing cooling air through said video control cabinet through a duct;

said duct splitting into an overboard branch and an inboard branch, said overboard branch having two shutoff valves in series and said inboard branch having an additional shutoff valve;

said inboard branch comprising a perforated duct exhausting downstream from said additional shutoff valve;

said perforated duct comprising holes for converting static pressure to dynamic pressure.

* * * * *